United States Patent [19]

Melcher et al.

[11] 4,060,771

[45] Nov. 29, 1977

[54] METHOD AND CIRCUIT ARRANGEMENT FOR CONDITIONING DIRECT CURRENT SIGNALS IN ELECTRIC MEASURAND TRANSMITTERS, PARTICULARLY ELECTROMECHANICAL PRECISION AND FINE BALANCES

[75] Inventors: Franz Josef Melcher, Ellierode; Christian Oldendorf, Goettingen, both of Germany

[73] Assignee: Sartorius-Werke GmbH (und vorm. Gottinger Prazisions-Waagenfabrik GmbH), Goettingen, Germany

[21] Appl. No.: 713,285

[22] Filed: Aug. 10, 1976

[30] Foreign Application Priority Data

Aug. 22, 1975 Germany .............................. 2537560

[51] Int. Cl.$^2$ ............................................. H03F 17/00
[52] U.S. Cl. ......................................... 330/59; 330/86; 330/107; 330/109; 330/141; 328/167
[58] Field of Search .................. 328/167; 330/109, 31, 330/21, 59, 86, 107, 141

[56] References Cited

U.S. PATENT DOCUMENTS

| | | | |
|---|---|---|---|
| 3,283,135 | 11/1966 | Sklaroff | 330/59 X |
| 3,528,040 | 9/1970 | Galvin | 330/86 X |
| 3,564,441 | 2/1971 | Eide | 330/31 |
| 3,904,978 | 9/1975 | Daniels et al. | 328/167 X |
| 3,946,328 | 3/1976 | Boctor | 330/107 |

*Primary Examiner*—John S. Heyman
*Attorney, Agent, or Firm*—Browdy and Neimark

[57] ABSTRACT

An electrical circuit for suppressing the effect of interfering alternating voltages of various frequencies superimposed upon a direct current signal in an electric measurand transmitter, such as in an electromechanical precision or fine balance, which comprises a signal line for carrying said direct current signal and interfering alternating voltages, means for low energy capacitively coupling-out of interfering alternating voltages of frequencies lower than a predetermined limit frequency from the signal line, means for energy amplifying and for inverting 180° in phase said coupled-out voltages, and means for capacitively coupling-back into the signal line the amplified and inverted coupled-out voltages.

8 Claims, 4 Drawing Figures

METHOD AND CIRCUIT ARRANGEMENT FOR CONDITIONING DIRECT CURRENT SIGNALS IN ELECTRIC MEASURAND TRANSMITTERS, PARTICULARLY ELECTROMECHANICAL PRECISION AND FINE BALANCES

The invention relates to a method and a circuit arrangement for the conditioning of direct current signals in electric measurand transmitters, particularly electromechanical precision and fine balances, on which interference signals in the form of interfering alternating voltages of various frequencies are superimposed and are suppressed by means of an active filter. In accordance with the DIN Standard the term "fine balances" also includes all kinds of analysis balances and microbalances.

Electronic balances are known in which an active filter is provided in order to suppress to the greatest possible extent any ripple in the output signal. An active filter of this kind which is provided in the output line does not however work without drift, that is to say its output variables, particularly its output voltage or output current, are subject to slow variations which are caused by ambient influences and by which the measurement results are influenced and falsified. Low-drift active filters are very elaborate and expensive.

A circuit arrangement for electronic measurand transmitters, particularly electromechanical balances of the kind described above, is also known, in which various switch means can be connected to the filter provided in the output line, or can be connected instead of the filter, in order to permit a rapid transient through a short time constant, while however permitting accurate measurement with a long time constant. Apart from the fact that this circuit arrangement also does not work without drift, it has the additional disadvantage that the switch-over operation gives rise to jumps in the indicator device of the balance, which for example in the fourth place of the indication (the 10° decade) may produce errors of up to 10 digits, which may then die down only with the long time constant.

In addition, an electric balance is known which has a measuring device and also a counting device periodically supplying a digital measurement result. In addition, in this known electric balance there is also provided an adjustable comparison device in which the measurement signals of the balance are compared in its position of rest with predetermined limit values, in such a manner that a digitalized measurement result is displayed in and/or transmitted to the indicator device only if these limit values are not attained or exceeded, at least for the duration of a measurement period. This circuit arrangement also does not work without drift and in addition is relatively extravagant in respect of the switch means.

The problem underlying the invention is therefore that of providing a method and a circuit arrangement of the kind defined above, in which the measurement results are damped without the influence of drift and with the least possible expense for circuitry, and any interfering alternating voltages resulting from oscillations, vibrations, or switching-on or switching-off operations are filtered out in optimum manner. According to the invention, for the purpose of solving this problem in a method of the kind defined above provision is made for the interfering alternating voltages having frequencies lower than a predetermined limit frequency to be subjected to low-energy capacitive coupling-out from the signal line, amplified in respect of energy, turned 180° in phase, and capacitively coupled back into the signal line.

In addition, in a circuit arrangement for carrying out the abovedescribed method of the invention provision is made for the active filter to be directly coupled by its input line, by way of a coupling-out capacitor, and by its output line by way of a feedback capacitor, to the signal line, and for the active filter to be in the form of a low-pass filter and to have an energy amplifier which as impedance converter amplifies by several powers the interference alternating voltages in respect of energy, but without affecting amplitude.

As the result of the capacitive coupling-out provided by the invention the direct current values in the analogue measurement signal are not affected, only minimum energy is taken from the measurement signal, and within the frequency range of the active low-pass filter the interfering alternating voltages are effectively damped entirely without drift, while because of the capacitive coupling the drift behaviour of the low-pass filter can have no effect on the measurement signal.

From the output to the input of the amplifier it is advantageous to provide a feedback coupling circuit, while it is preferable for constant resistors to be disposed upstream and downstream of the capacitive feedback capacitor in the output line, these resistors together with the capacitors form the capacitive coupling-out and feedback respectively determining the time constants and consequently the frequency behaviour of the entire active low-pass filter.

Low-pass filters of this kind can follow variations of the measurement signal of the circuit arrangement working without drift only with a certain delay, which is determined by the particular electrical properties of the filters used. For the purpose of switching over the time constants of the active low-pass filter between long and short time constants, a further development of the invention provides for a plurality of additional resistors to be connected in parallel to the constant resistors by means of a switch without switch-on surges occurring, while in order to permit the continuous parallel connection of the additional resistors it is preferable for a photoresistor, adapted to be acted on by a light emitting diode under preselected control, to be adapted to be connected in parallel to the constant resistor in the output line. It is advantageous for the light emitting diode to be able to be continuously dimmed after a preselected time delay.

Thus immediately after a weight has been placed in position a starting signal can be transmitted by means of a standstill monitoring device, an automatic feed unit, or else manually, this signal closing the switch and switching on the light emitting diode, which then illuminates the photoresistor. Through the closing of the switch and the switching-on of the light emitting diode, resistors are connected in parallel and the low-pass filter is switched over to a short time constant. As soon as the transient time of the balance is at or approaching its end, the light emitting diode is slowly dimmed again after a preselected time delay and the switch is then opened again, so that the low-pass filter is again adjusted to a considerably longer time constant without any switch surge.

The switch for the connection of the resistors in parallel is preferably in the form of a semiconductor switch composed of MOS field effect transistors, while it is advantageous to provide a control device for the light emitting diode and/or the switch.

According to another advantageous further development of the invention, a comparator circuit serving as vibration detector is coupled to the output of the active low-pass filter, but upstream of the feedback capacitor, and the low-resistance interfering alternating voltages tapped off there are fed to a comparator having an adjustable amplitude set point for the purpose of amplitude monitoring, the comparator preferably being followed by a monostable multivibrator, which is set back when the interference signal exceeds the desired amplitude adjusted in the comparator.

It is advantageous for the two half-waves of the interfering alternating voltages to be amplified in separate amplifiers and then rectified. With the aid of the monostable multivibrator the comparator is thus always set back when the blocking signal in the comparator exceeds the adjusted desired amplitude. When therefore the comparator has not responded over a fixed period of time, this shows that the measurand transmitter has reached its stationary state or has been steadied to such an extent that the measurand can now be indicated or stored without error.

The invention is explained below by way of example with reference to the drawings, in which.

Figure 1:
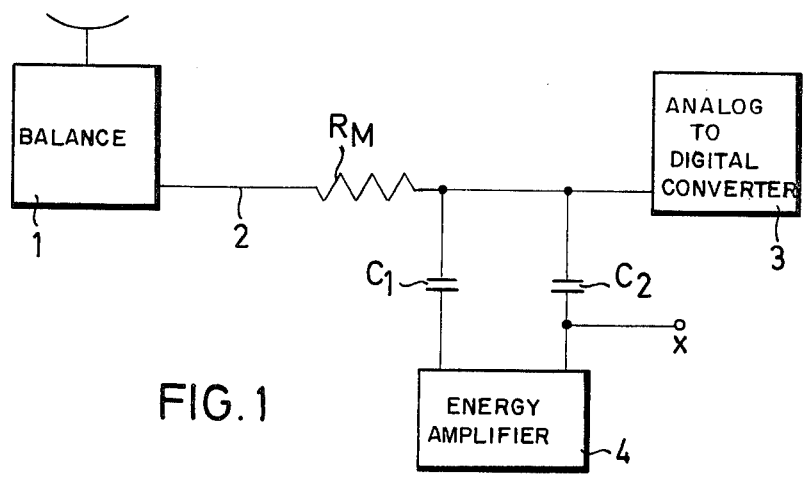
FIG. 1 illustrates diagrammatically, and partly in the form of a block diagram, a circuit arrangement according to the invention.

FIG. 1 shows diagrammatically a balance 1 which is connected, for example, to an analogue-digital converter 3 by way of an output line 2 and a fixed resistor $R_M$. Downstream of the fixed resistor $R_M$ interfering alternating voltages are capacitively coupled out of the line 2 by means of a capacitor $C_1$, for which purpose only minimum energy is taken from the measurement signal on the line 2.

The coupled-out interfering alternating voltages are then amplified by several powers in respect of energy, but not in amplitude, in an apparatus 4, and in the case of frequencies which are lower than a predetermined limit frequency $w_o$ are turned 180° in phase and coupled back to the line 2 at the output of the apparatus 4 by way of another capacitor $C_2$, that is to say likewise capacitively. In this way the interfering alternating voltages of the measurement signal on the line 2 are effectively damped within the frequency range of the low-pass filter provided in the apparatus 4. The capacitive coupling-in and coupling-out of the interfering alternating voltages has the effect that the direct voltage or direct current behaviour, that is to say the drift properties of the amplifier and of the active low-pass filter, have no effect on the measuring circuit, in contrast to known circuit arrangements disposed directly in the line.

Figure 2:
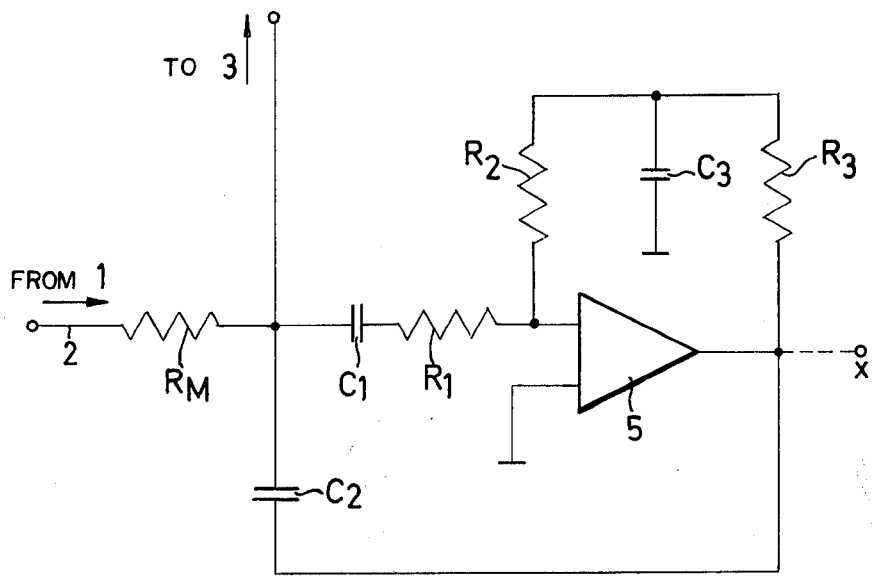
FIG. 2 shows diagrammatically an advantageous embodiment of the invention.

FIG. 2 shows a preferred form of circuit arrangement according to the invention, wherein the same or corresponding components are given the same references. The output line 2, the measurement path, once again contains in this circuit arrangement the fixed resistor $R_M$, which as a constant resistor can for example also be taken into account in the calibration of the sensitivity of the balance. The capacitor $C_1$, which is provided for capacitive coupling-out of the interfering alternating voltages, is followed by a resistor $R_1$ the other side of which is connected to one input of an amplifier 5, which amplifies by several powers the energy, but not the amplitude, of the interfering voltages. The output of the amplifier 5 is fed back by way of a feedback network of resistors $R_2$ and $R_3$ and also a capacitor $C_3$ to the amplifier input. The output of the amplifier 5 is in addition connected to the line 2 by way of the capacitor $C_2$ for the purpose of coupling out the interference voltages which are amplified in energy and turned 180° in phase, the line 2 leading for example, as in FIG. 1, to an analogue-digital converter 3.

The frequency behaviour of the active low-pass filter is determined in this circuit arrangement by the two times constants $R_1 C_1$ and $R_M C_2$. If the frequencies which are to be damped in the disturbing voltages are then considerably lower than the limit frequency $w_1$ of the low-pass filter, which is of the order of 1 to 2 Hz, the output of the amplifier is fed back negatively, whereas in the case of interfering frequencies which are considerably higher than the limit frequency $w_o$ of the low-pass filter it is fed back positively. This can however be tolerated, because it entails only the damping of frequencies $>> w_o$. The feedback network ($R_2$, $C_3$, $R_3$) of the amplifier 5 is so proportioned and selected, in conjunction with the resistor $R_1$, that with positive feedback operation the amplification in the feedback loop is not positive. In this way any tendency of the circuit arrangement to oscillate can be suppressed in optimum manner, so that a very short step-function response is obtained.

Figure 3:
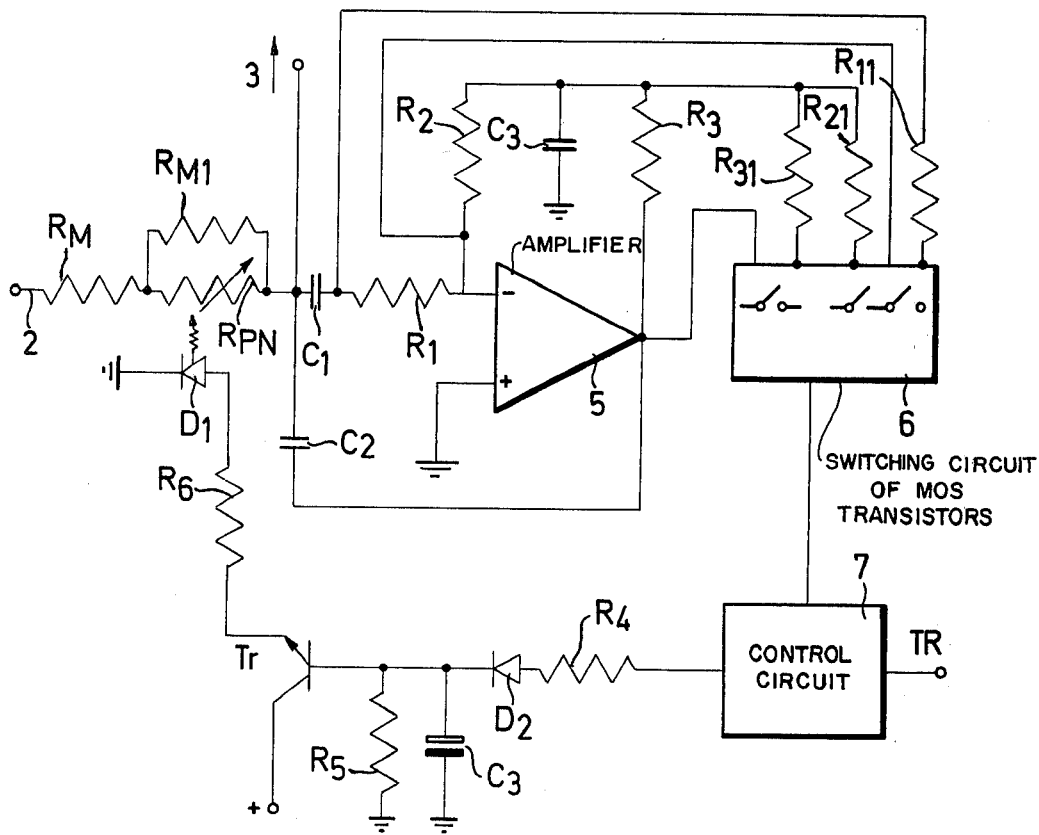
FIG. 3 shows another preferred embodiment of the invention with an arrangement for switching over the time constants of the active low-pass filter.

FIG. 3 shows an advantageous further development of the circuit shown in FIG. 2, wherein during the transient of the balance 1 the active low-pass filter is switched over to a short time constant, while after the transient has died down a time constant is brought back which under normal weighing conditions permits steady, perfect determination of weight.

In order to achieve this switching-over of the time constant, a photoresistor $R_{pn}$, whose resistance value can be varied by means of a light emitting diode $D_1$, is connected in series with the fixed resistor $R_M$; another fixed resistor $R_{M1}$ is connected in parallel to the photoresistor $R_{pn}$. By means of a diagrammatically represented switch 6, which for example may be a semiconductor switch composed of MOS field effect transistors, additional resistors $R_{11}$, $R_{21}$, and $R_{31}$ are adapted to be connected in parallel respectively with the resistors $R_1$ to $R_3$ already mentioned in connection with FIG. 2. In addition, a control device 7 is provided at whose TR input a starting signal is produced, for example immediately after the weight has been laid in position, by means of a standstill monitoring device, an automatic feed unit, or else manually. The control device 7 is connected to the light emitting diode $D_1$ by way of a delay circuit consisting of the resistors $R_4$ to $R_6$, a diode $D_2$, a capacitor $C_3$, and a transistor $T_r$.

As soon as the starting signal is applied to the TR input, the control device 7 on the one hand closes the switch 6 and on the other hand switches on the light emitting diode $D_1$ by way of the delay circuit. Through the switching-on of the light emitting diode $D_1$ the latter is lit up and thus the value of the photoresistor $R_{pn}$ connected in parallel to the resistor $R_{M1}$ is reduced to such an extent that the value of the photoresistor $R_{pn}$ becomes lower than the value of the resistor $R_{Ml}$. At the same time the switch 6 connects the resistors $R_{11}$, $R_{21}$, to $R_{31}$ in parallel to the corresponding resistors $R_1$ to $R_3$ of the low-pass filter. Through the connection in parallel of the resistors $R_{Ml}$ and $R_{PH}$, $R_1$ and $R_{11}$, $R_2$ and $R_{22}$, and also $R_3$ and $R_{33}$, the low-pass filter is switched over to a short time constant and thus has a correspondingly rapid transient.

When after a determined transient time of the balance the low-pass filter is then to be switched back to its long time constant and thus to better damping behaviour, the light emitting diode $D_1$ is controlled by the control device 7 in such a manner that after a preadjusted time, starting from the starting signal, it is slowly dimmed; the value of the photoresistor $R_{pn}$ then accordingly becomes continuously high. If the resistance value of the photoresistor $R_{pn}$ is then once again very much higher than that of the resistor $R_{Ml}$ connected in parallel, the active low-pass filter is again switched over to the long time constant and thus again achieves its maximum damping behaviour. In addition, the switch 6 is switched off again in order to ensure undisturbed working of the amplifier 5.

Through the continuous dimming of the light emitting diode $D_1$ and the consequent slow raising of the resistance value of the photoresistor $R_{pn}$, that is to say the steady lengthening of the time constants, the switch 6 can be opened at a moment at which it is ensured that no switch surges can act on the low-pass filter as the result of the switching operation.

As an example, the circuit arrangement shown in FIG. 2 has a step-function response time of about 15 seconds at a limit frequency of about 1 Hz, while through the switching-over of the time constants for the duration of the transient in the circuit arrangement in FIG. 3 the step-function response time can be shortened very considerably without any displacement of the indication being caused thereby.

Figure 4:
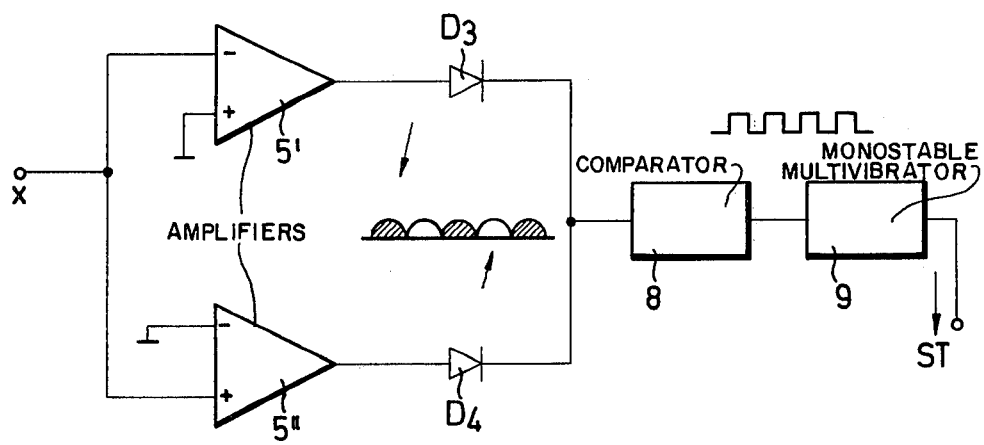
FIG. 4 shows in the form of a block diagram another circuit arrangement of the invention, which can be used as vibration detector.

Finally, in FIG. 4 is shown a circuit arrangement which works without drift and which can be used in particular in conjunction with the active low-pass filter as an analogue vibration detector in balances. The output of the active low-pass filter is here tapped off at the point $x$ directly upstream of the coupling-out capacitor $C_2$, as shown in FIGS. 1 and 2. The voltages tapped off at the point $x$ are proportional to the interference voltages superimposed on the measurement voltage and can be regarded as vibration criteria for the measurand transmitter, for example the balance 1.

Each half-wave of the low-resistance interference voltages tapped off at the point $x$ is amplified by amplifiers 5' and 5" and rectified in diodes $D_3$ and $D_4$, thereby obtaining the half-waves diagrammatically shown in FIG. 4. The amplified and rectified interfering voltages are compared in a comparator 8 with a desired amplitude adjusted in the latter. As soon as the amplified and rectified interference voltages exceed the desired amplitude and consequently the threshold of the comparator 4, a monostable multivibrator or monovibrator 9 connected downstream of the comparator is set back and thus retarded to the extent of its delay time. This operation, namely the bringing into circuit of the monovibrator 5 and the corresponding retarding of its output as soon as the interfering signal exceeds the threshold of the comparator 8, is repeated until the interfering voltages at the tapping point $x$, that is to say the interfering voltages on the output signal of the balance 1, have been smoothed to such an extent that the threshold of the comparator 8 is no longer exceeded. The standstill or extensive steadying of the measurand transmitter in the form of the balance 1 is achieved when the comparator has not responded over a determined, fixed period of time. With the aid of the amplitude monitoring effected in the comparator 8, that is to say comparison of a set desired amplitude with the amplitude of the tapped interfering voltage, there has been obtained for the balance 1, with relatively little expense for circuitry, a vibration detector at whose output ST a standstill signal occurs only when the balance has reached a standstill or a required steadiness. The expense for the vibration detector is very low because the output signal of the active low-pass signal is a low-resistance signal and thus an impedance converter is not required.

We claim:

1. A electrical circuit for suppressing the effect of interfering alternating signals of various frequencies superimposed upon a direct current signal in measuring apparatus, such as in an electromechanical precision or fine balance, the circuit comprising a signal line for carrying the direct current signal and the interfering alternating signals; coupling-out means for capacitively coupling-out of interfering alternating signals of frequencies lower than a predetermined limit frequency from said signal line; amplifying and inverting means for amplifying and inverting 180° in phase the coupled-out signals; coupling-back means for capacitively coupling-back into said signal line the amplified and inverted coupled-out signals; wherein said coupling-out means, said amplifying and inverting means, and said coupling-back means form an active low-pass filter and said coupling-out means and said coupling-back means each include a respective capacitor means directly connected to said signal line; variable resistive circuit means in circuit with said capacitor of said coupling-out means, said resistive circuit means, with respective said capacitor means of said coupling-out means and said coupling-back means, determining the time constant of said active low-pass filter; wherein said coupling-out means includes a pair of resistors in parallel with one another, one of which is a variable resistor for altering said time constant of said active low-pass filter, said variable resistor being a photoresistor; a light emitting diode positioned opposite said photoresistor; a circuit for supplying current to said light emitting diode; a control circuit coupled to said circuit for supplying current to said light emitting diode via a time delay circuit for turning on said light emitting diode after a predetermined delay upon receipt of a control signal; a switching circuit coupled to said control circuit and responsive to an output therefrom; said variable resistive circuit means being coupled to said switching circuit and responsive thereto for changing the resistance value of said resistive circuit means to provide a lower time constant for said active low-pass filter upon receipt of an output from said switching circuit.

2. A circuit according to claim 1, wherein said amplifying and inverting means comprises an impedance converter which amplfies coupled-out alternating signals with respect to energy without substantially effecting voltage amplitude.

3. A circuit according to claim 1, wherein a feedback circuit is provided from output to input of the amplifying and inverting means.

4. A circuit according to claim 3, wherein said feedback circuit includes a plurality of resistors forming part of said resistive circuit means, and said switching circuit is a means for switching said resistors into and out of said feedback circuit.

5. A circuit according to claim 4, wherein said means for switching comprises MOS field effect transistor switch means for switching without the occurrence of switching surges.

6. A circuit according to claim 1, additionally including a comparator coupled to an output of said low-pass filter, said comparator including an adjustable voltage amplitude reference means whereby amplitude of coupled-out interfering signals are monitored.

7. A circuit according to claim 6, wherein said comparator actuates a monostable multivibrator whose delay time is set back by said comparator whenever the amplitude detected by the latter exceeds a predetermined voltage amplitude reference level.

8. A circuit according to claim 6, including separate amplifiers receiving the interfering alternating signals for separately amplifying the two half-waves of the interfering alternating signals, separate rectifying means coupled respectively to said separate amplifiers for rectifying the amplifier signals therefrom, and means for combining the rectified signals and feed said comparator.

* * * * *